United States Patent
Graham et al.

(10) Patent No.: US 6,324,230 B1
(45) Date of Patent: Nov. 27, 2001

(54) MULTIMODE FAST ATTACK AUTOMATIC GAIN CONTROL (AGC) LOOP FOR NARROW BAND RECEIVERS

(75) Inventors: David J. Graham, Gilbert, AZ (US); Dane E. Blackburn, Lake Worth; Raul Salvi, Boca Raton, both of FL (US); Keith Tilley, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,741

(22) Filed: Feb. 29, 2000

(51) Int. Cl.[7] .................................................. H04L 27/08
(52) U.S. Cl. .................. 375/345; 455/234.2; 455/241.1; 455/245.1
(58) Field of Search .............................. 375/345; 330/254, 330/278; 329/350; 455/232.1, 234.1, 234.2, 241.1, 245.1, 245.2, 250.1

(56) References Cited

U.S. PATENT DOCUMENTS

| | | | |
|---|---|---|---|
| 4,963,969 | * 10/1990 | Kitaura et al. | 358/174 |
| 5,053,877 | * 10/1991 | Kondo et al. | 358/228 |
| 5,267,272 | * 11/1993 | Cai et al. | 375/345 |
| 5,606,284 | * 2/1997 | Tamesue et al. | 330/129 |
| 5,742,899 | 4/1998 | Blackburn et al. . | |
| 5,940,143 | * 8/1999 | Igarashi et al. | 348/678 |

* cited by examiner

Primary Examiner—Don N. Vo
(74) Attorney, Agent, or Firm—Scott M. Garrett

(57) ABSTRACT

A multimode fast attack automatic gain control (AGC) circuit (100) includes an analog feedback loop and a digital feedback loop. The analog feedback loop is switched into the amplifier stage (102) by a first switch (126) when dynamic control of the gain attenuation is desired. The digital feedback loop is switched into the amplifier stage when attenuation is to be adjusted periodically, such as between sequentially received time slots in a time division multiple access (TDMA) mode of communication.

10 Claims, 3 Drawing Sheets

MULTIMODE FAST ATTACK AUTOMATIC GAIN CONTROL (AGC) LOOP FOR NARROW BAND RECEIVERS

CROSS REFERENCE

This application is related to patent application entitled "Method and Apparatus for Settling and Maintaining a DC Offset," which is a continuation-in-part of application Ser. No. 09/290,564 filed Apr. 13, 1999, Tilley, et al., entitled "Method and Apparatus for Settling a DC Offset," and also related to patent applications entitled "DC Offset Correction Loop for Radio Receiver," by Ferrer, et al., entitled "DC Offset Correction Adaptable to Multiple Requirements," filed concurrently herewith, assigned to Motorola, Inc., and incorporated herein by reference.

FIELD OF THE INVENTION

This invention relates in general to narrow band receivers, and in particular to narrow band zero intermediate frequency (ZIF) receivers. Specifically, this invention relates to narrow band ZIF receivers that employ automatic gain control (AGC), and are operated in a plurality of modes of communication.

BACKGROUND OF THE INVENTION

Narrow band ZIF receivers tend to have slow AGC loop settling times. This is due in part to the closed loop nature of AGC systems and the fact that narrow bandwidth filters tend to add lengthy phase delays near the filter corner frequencies, thereby placing stability limitations on the maximum loop bandwidth of an AGC loop. For narrow band ZIF receivers, AGC settling times in the 4–6 millisecond range are considered exceptional. Notwithstanding, there are several emerging applications where settling times under 2 milliseconds are required. AGC Loops wide enough to theoretically achieve the desired settling times are typically unstable or under-damped and therefore induce excessive ripple in the AGC loop gain control signal. An alternative solution suggests switching to a faster AGC loop during settling and then switching back to the slower loop during normal operation. Unfortunately, when a fast AGC loop is switched to a slower AGC loop, ripple in the gain control signal due to fast loop tracking of the amplitude modulated (AM) signal can leave the control signal at an arbitrarily high level. Additional settling time is required to recover from this overshoot condition. As will be appreciated by those skilled in the art, this additional settling time only operates to defeat the purpose of adapting the fast loop in the first instance.

A solution to these problems is taught in U.S. Pat. No. 5,742,899, titled "Fast Attack Automatic Gain Control (AGC) Loop For Narrow Band Receivers," the disclosure of which is hereby incorporated by reference. The apparatus described in that patent has functioned well in its intended application, but the present communications market has made it desirable to have so-called multimode communication devices. By multimode it is meant that the communication device is capable of communicating using more than one air interface, such as Advanced Mobile Phone Service (AMPS), Global System for Mobile communications (GSM), and so on. For these types of air interfaces it is preferable to use digital control to control the AGC attenuation in the amplifier stage. Thus there is a need for an AGC control that addresses the needs of multimode communication devices.

DETAILED DESCRIPTION OF THE PREFERRED EMBODIMENT

Figure 1:
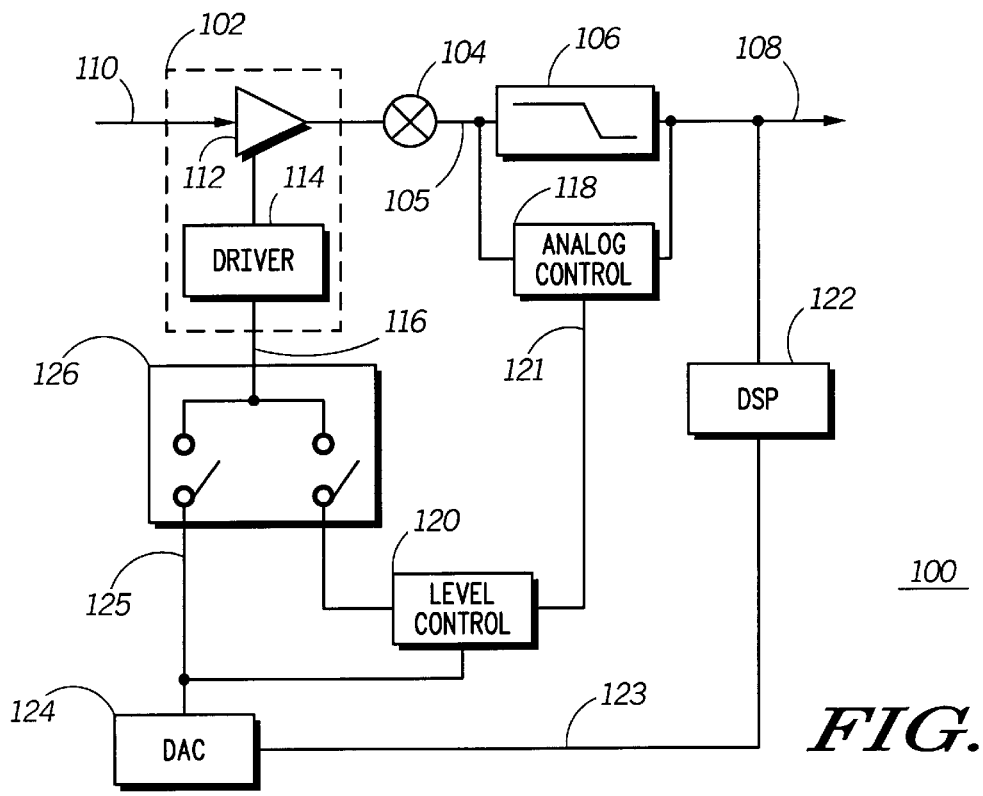
FIG. 1 is block diagram of a multimode AGC circuit including both an analog feedback AGC control loop and a digital feedback AGC control loop.

While the specification concludes with claims defining the features of the invention that are regarded as novel, it is believed that the invention will be better understood from a consideration of the following description in conjunction with the drawing figures, in which like reference numerals are carried forward.

The invention provides both an analog feedback AGC loop and a digital feedback AGC loop that are alternatively switchable in connection with the amplifier stage of the forward transmission path. The analog feedback loop is used to control AGC operation during modes of communication such as when operating in accordance with the Advanced Mobile Phone Service (AMPS) specification, or in accordance with the operation of the integrated digital radio services communication system manufactured by Motorola Inc., and sold under the tradename iDEN. When the analog feedback AGC loop controls operation of the amplifier stage, the gain component is adjusted dynamically while receiving a signal. In contrast, the digital feedback AGC loop is used when operating, for example, in accordance with the Global System for Mobile communications (GSM) specification. In this mode a digital signal processor (DSP) controls a digital to analog converter (DAC) which is switchably coupled to the amplifier stage. In this mode of operation information is received in very short time slots, and the AGC level is adjusted between time slots by the DSP.

Referring now to FIG. 1, there is shown a block diagram of a multimode fast attack AGC circuit 100 including both an analog feedback AGC control loop and a digital feedback AGC control loop, in accordance with the invention. It is intended that the circuit be used in a communication device such as a mobile radio telephone, for example. The circuit comprises a forward transmission path including an amplifier stage 102, a down mixer 104, and a low pass filter 106. The output of the down mixer is a raw baseband signal 105, which is filtered by the low pass filter to provide a filtered baseband signal at the output 108. The output 108 of the forward transmission path is sampled and used to control AGC operation. The amplifier stage receives an input signal 110 from an antenna, for example, and includes a gain component 112 and preferably a driver circuit 114 for driving the gain component. In the preferred embodiment the driver circuit 114 has a linear slope verses input power level, where the slope is defined as decibel (dB) of attenuation per amplifier volt change in gain control signal. The slope is expressed mathematically as dB/Volts. In other words, a linear change in voltage at the input 116 of the driver circuit causes a linear change in dB of attenuation at the gain component 112. The analog feedback loop is comprised of an analog control circuit 118 and a level control circuit 120. The level control circuit receives an analog feedback control signal on line 121 and acts to stabilize it for delivery to the amplifier stage 102. The digital feedback loop comprises a means for sampling the output of the forward transmission path and converting it to a digital value and a means for processing the digital values, together incorporated into a DSP circuit 122. The DSP circuit processes the digitized samples of the output of the forward transmission path in accordance with known principles of mobile communication, and provides a digital word over a bus 123 to a DAC 124. The DAC converts the digital word to an analog voltage level to provide a digital feedback control signal 125. A first switch means 126 is used for alternatively coupling the analog feedback control signal or the digital feedback control signal to the amplifier stage. In the preferred embodiment the first switch means is an electronic switch means, such as transistors, for example. The effect is the same as either a single pole, double throw switch or a pair of single pole, single throw switches.

In the preferred embodiment, the analog control circuit 118 and level control is substantially that disclosed in U.S. Pat. No. 5,742,899 to Blackburn et al., the disclosure of which has been incorporated by reference hereinabove. The circuit described therein samples the off channel signal content before the low pass filter and the on channel signal content after the low pass filter and provides fast pull-down and overshoot recovery as well as normal mode loop operation.

Figure 2:
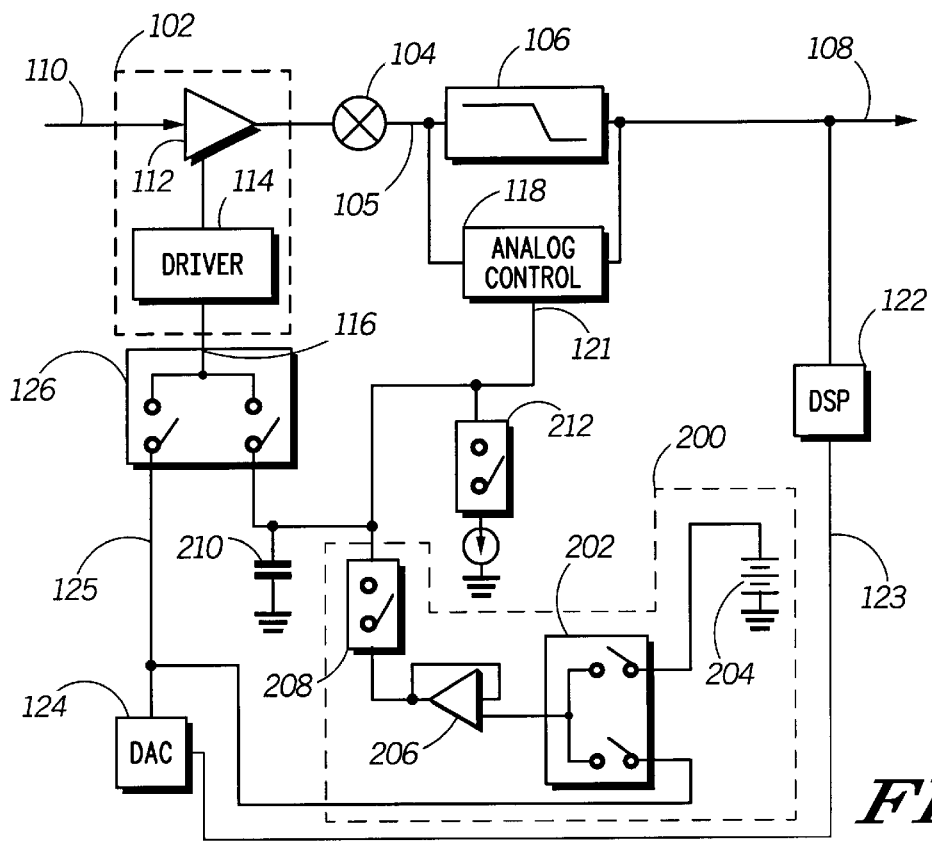
FIG. 2 is a detailed block diagram of a multimode AGC circuit detailing the level control circuitry of FIG. 1.

Referring now to FIG. 2, there is shown a detailed block diagram of a multimode AGC circuit detailing the level control circuitry of FIG. 1. Specifically there is a preset circuit means 200 for setting the analog feedback control signal level to known value. In the prior art it was shown that a known reference voltage 204 could be used to preset the level on line 121 to a maximum level, or another fixed, known level if so desired. Here the invention uses a second switch means 202 for alternatively coupling the preset circuit means to the DAC 124 or the reference voltage 204. In this way the DAC can be used to preset the analog feedback control signal level to an intermediate level if so desired. This is likely to occur when the communication device has a priori information as to the level of a signal to be received, such as when switching serving cells, for example. The signal from either the voltage reference of the DAC is buffered by a buffer 206, and is switchably coupled to the analog feedback control line 121 by a switch 208, as in the prior art. When the switch 208 is closed, voltage from the buffer 206 charges up an integrating capacitor 210 to the level of the voltage fed to the buffer through the second switch means 202, either the DAC voltage of the reference voltage. A current sink 212 is switchably coupled to line 121 to control charge balance in the integrating capacitor while the analog feedback loop controls operation of the amplifier stage, as described in the prior art.

In operating the circuit, the analog feedback loop is coupled to the amplifier stage when the communication device is operated in a first communication mode, and the digital feedback loop is coupled to the amplifier stage when the communication device is operated in a second communication mode. An example of a first communication mode is when the communication device is operated, for example, in an AMPS mode. An example of a second mode of communication is when the communication device is operated in a GSM mode.

Figure 3:
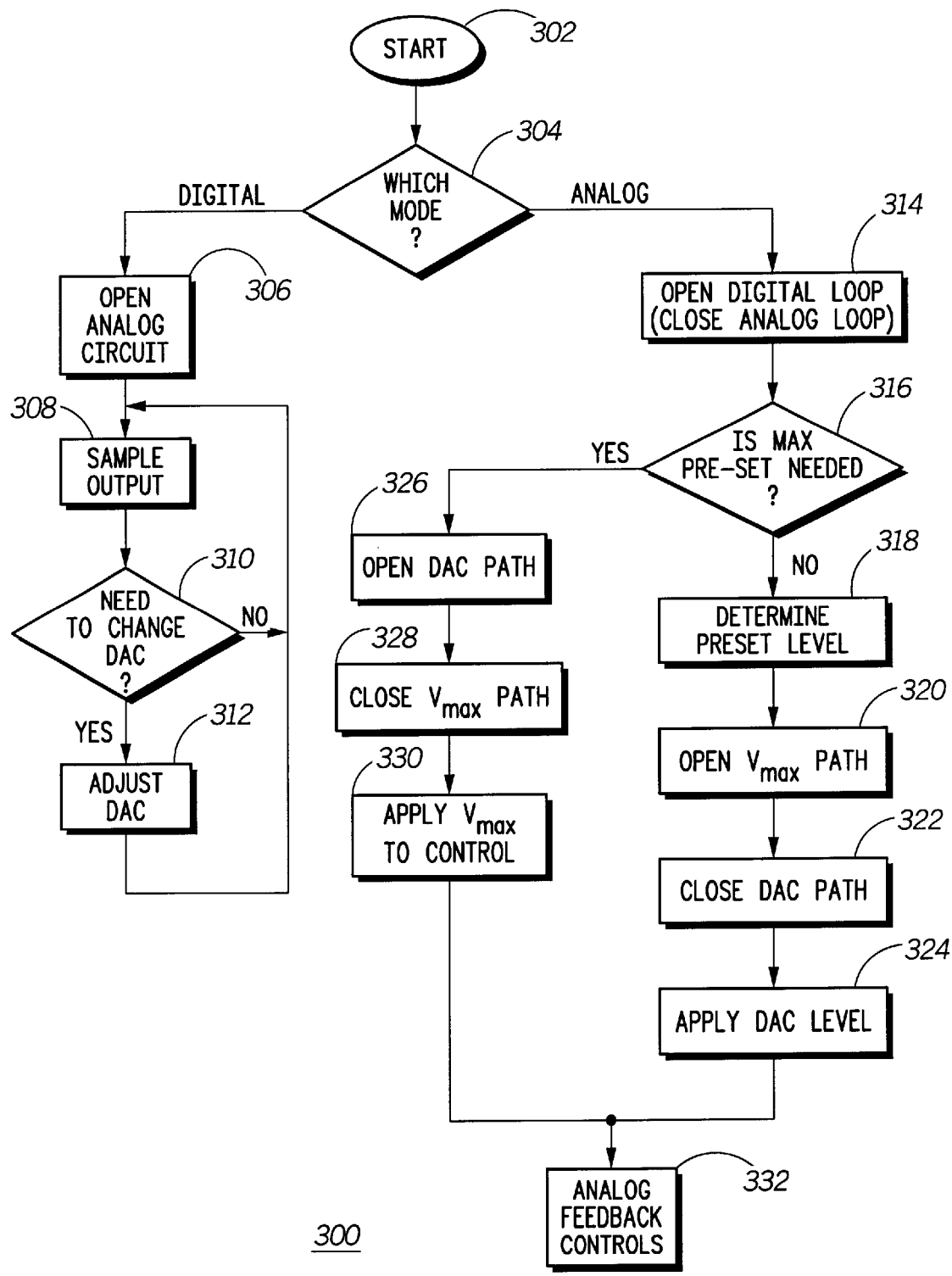
FIG. 3 is a flow chart diagram for operating the multimode AGC circuit of FIGS. 1–2.

Referring now to FIG. 3, there is shown a flow chart diagram 300 for operating the multimode AGC circuit of FIGS. 1–2. At the start 302 the communication device is powered up and ready to commence service in one of a plurality of communication modes. Numerous modes of communication exist, examples of which include AMPS, GSM, integrated radio services such as the Motorola "iDEN" system, digital cellular in accordance with the IS-56 and IS-136 standards, code division multiple access (CDMA) and personal communication service (PCS). The first step is determining (304) mode of feedback to use, either the analog feedback control or the digital feedback control. The decision as to which feedback path to use will be determined by the specifics of the air interface of the communication mode, but in general the analog feedback path is used when dynamic control is desired, and the digital feedback is used when the control can be periodically adjusted.

If it is determined that digital feedback control is desired, the first switch means is used in coupling a digital feedback loop between the output of the forward transmission path and the amplifier stage through a first switch means if the communication device is in the second communication mode. This also involves opening (306) the analog feedback path at the first switch means. At this point if the communication device has a priori information, it can preset the DAC to an appropriate level, otherwise the DSP will sample the output of the forward transmission path (308). If the DSP determines there is a need to change the present value of the DAC output (310), then it will adjust the DAC (312) by writing a new digital word on the DAC bus 123 corresponding to the desired level of attenuation at the gain component 112 of the amplifier stage 102. The process is repeated so long as the communication device is receiving information while the digital feedback loop is active. Typically, the digital feedback loop is active during, for example, a GSM mode of operation. GSM is a time divisioned system, meaning information is received during a sequence of time slots during which information for the particular communication device is transmitted by a serving cell, for example. The DSP processes the information received, and makes the determination to change the DAC level (310) between sequential time slots.

If it is determined that the analog feedback control is desired at step 304, then the first subsequent step performed is coupling (314) the analog feedback loop between the output of the forward transmission path and the amplifier stage 102 through the first switch means 126. This is equivalent of opening the digital feedback path from the amplifier stage. The next step is to determine what preset level (316) is needed on the analog feedback control line 121. If the maximum preset is needed, the second switch means 202 couples the reference voltage 204 to the buffer 206, and closes the switch 208. This is done by opening the path (326) between the DAC and the buffer at the second switch means (326), closing the path to the reference voltage (328), and closing the buffer switch 208 (330).

If an intermediate level of preset is required, the DSP determines how much (318) voltage should be applied, then the second switch means opens the path (318) between the reference voltage and the buffer, while closing (322) the path between the DAC and the buffer, then applying the buffer output (324) through the buffer switch to the analog feedback control line 121. Henceforth the analog circuit dynamically adjusts the level on line 121, as described in the prior art. When either the DAC or the reference voltage is used to preset the analog feedback control line, the integrating capacitor is charged to a level corresponding to a desired level of gain attenuation at the gain component 112, as controlled by the driver circuit 114.

Figure 4:
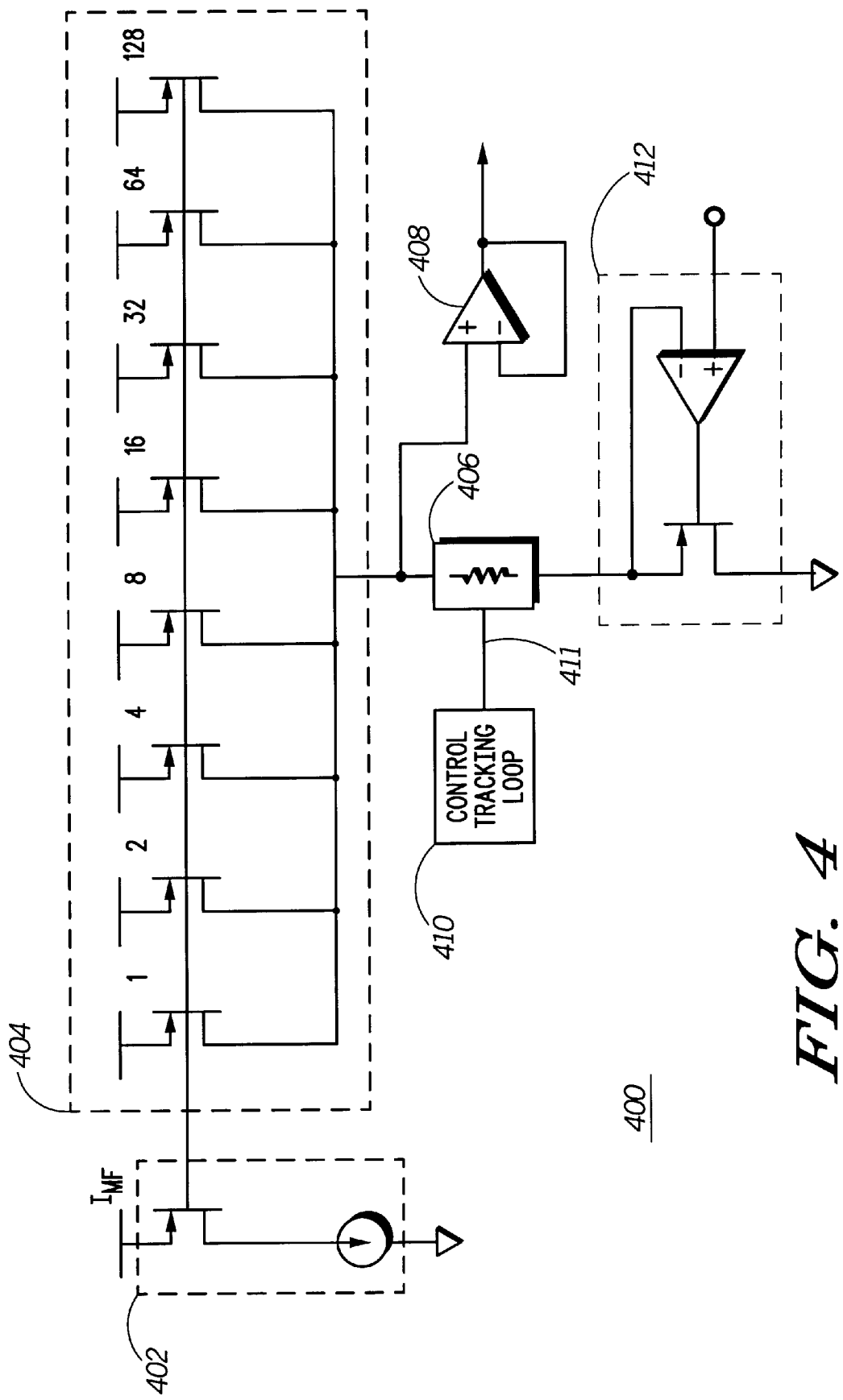
FIG. 4 is a schematic diagram of a digital to analog converter for use with a multimode AGC circuit in the digital feedback AGC control loop.

Referring now to FIG. 4, there is shown a schematic diagram 400 of a digital to analog converter for use with a multimode AGC circuit in the digital feedback AGC control loop. The DAC comprises a current reference 402, and plurality of binary weighted current mirrors 404 coupled to the current reference, an adjustable resistance 406 into which current from the current mirrors flows, a buffer 408, and a control tracking loop 410. The DAC may further comprise a ground level control circuit 412 for adjusting the ground reference voltage level.

The current reference 402 establishes the smallest step change in current desired. Each of the plurality of binary weighted current mirrors provides a binary multiple of the current reference current. So, for example, there is one current mirror for providing 1, 2, 4, 8, 16, 32, . . . , n times the current of the current reference. Each of these is in turn tied to a corresponding bit of the DAC bus 123. Eight current mirrors allows 256 steps in increments equal to the current reference current. It will be appreciated by those skilled in the art that the current reference will have a temperature dependency and a process dependency. By process dependency it is mean that differences between subsequently manufactured current references will slightly vary the current reference value. In general the dependency can be expressed as a ratio of source voltage Vdd over the resistance Rref in the current reference, or Vdd/Rref. As the temperature of the current reference changes, so will the current reference value.

The adjustable resistance is controlled such that it stays constant over temperature and process variations. This is accomplished by the control tracking loop 410, by using the resistance in a tracking oscillator. Essentially, as is known in the art, a time constant is established between the resistance to be controlled and a capacitor, creating an RC circuit. The control tracking loop maintains the RC time constant at a predetermined level by adjusting the resistance to counteract any tendency to change over temperature, and over process variations. As a result, the voltage provided by the DAC at the output of the buffer, which is fed to the first and second switch means, is dependent on the Vdd/Rref ratio of the current reference. However, this dependency is desired because the driver circuit 114 will have a dependency that can be expressed as Rd/Vdd. Since the Rd of the driver circuit and the Rref of the current reference will be co-located, they will have similar temperatures, and this will be even more true if these circuits are realized together on an integrated circuit. Thus, the net effect is that the dependencies of the current reference and the driver circuit nullify the effects of temperature and process variations by keeping the output resistance of the DAC, the adjustable resistance 406, at essentially a zero tolerance state.

Thus, the invention solves the problem encountered in implementing a multimode communication device having a fast attack AGC control requirement by providing both an analog feedback loop and a digital feedback loop. Each are used at the appropriate time, as dictated by the communication mode presently engaged. Furthermore, by using a digital feedback loop, the analog feedback loop can be set to a maximum reference level or any intermediate level.

The invention also provides for a digital to analog converter (DAC) that provides a specifically designed temperature and/or process dependent output to counteract similar dependencies in the amplifier stage, specifically in a driver circuit of the amplifier stage, so that a digital setting will produce the same level of attenuation independent of temperature and process variations. That is, the digital to analog conversion means comprises a dependency compensation means for compensating the driver circuit While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A multimode fast attack Automatic Gain Control (AGC) circuit having a forward transmission path with an amplifier stage responsive to receipt of a control signal that alters the amplifier stage gain component and a down mixer for providing a baseband signal at an output, the multimode fast attack AGC circuit comprising:

an analog feedback loop at an output of the forward transmission path for generating an analog feedback control signal;

a digital feedback loop at the output of the forward transmission path, including a digital to analog converter means for generating a digital feedback control signal;

first switch means for alternatively coupling the analog feedback control signal or the digital feedback control signal to the amplifier stage;

preset circuit means for setting the analog feedback control signal to known value; and second switch means for alternatively coupling the preset circuit means to the digital to analog converter means or a reference voltage.

2. A multimode fast attack AGC circuit as defined in claim 1, wherein the amplifier stage comprises a driver circuit for driving the gain component; and wherein the digital to analog conversion means comprises a dependency compensation means for compensating the driver circuit.

3. A multimode fast attack AGC circuit as defined in claim 2 wherein the driver circuit drives the gain stage component such that a linear attenuation per volt input is achieved, wherein the attenuation is measured in decibels.

4. A multimode fast attack AGC circuit as defined in claim 1, further comprising an integrator capacitor and a current sink coupled to the analog feedback loop.

5. A multimode fast attack Automatic Gain Control (AGC) circuit having a forward transmission path with an amplifier stage responsive to receipt of a control signal that alters the amplifier stage gain component and a down mixer for providing a baseband signal at an output, the multimode fast attack AGC circuit for use in a multimode communication device capable of operating in a first communication mode and a second communication mode, the multimode fast attack AGC circuit comprising:

an analog feedback loop at an output of the forward transmission path for generating an analog feedback control signal;

a digital feedback loop at the output of the forward transmission path, including a digital to analog converter means for generating a digital feedback control signal;

first switch means for alternatively coupling the analog feedback signal or the digital feedback signal to the amplifier stage;

preset circuit means for setting the analog feedback control signal to known value; and second switch means for alternatively coupling the preset circuit means to the digital to analog converter means or a reference voltage;

wherein the analog feedback loop is coupled to the amplifier stage when the communication device is operated in the first communication mode, and the digital feedback loop is coupled to the amplifier stage when the communication device is operated in the second communication mode.

6. A multimode fast attack AGC circuit as defined in claim 5, wherein the second communication mode is a time division multiplex communication mode, the communication device receives data during sequential time slots, the digital feedback loop adjusts the digital control signal between sequential time slots.

7. A multimode fast attack AGC circuit as defined in claim 5, wherein the amplifier stage comprises a driver circuit for driving the gain stage component; and wherein the digital to analog conversion means comprises a dependency compensation means for compensating the driver circuit.

8. A multimode fast attack AGC circuit as defined in claim 7 wherein the driver circuit drives the gain stage component such that a linear attenuation per volt input is achieved, wherein the attenuation is measured in decibels.

9. A multimode fast attack AGC circuit as defined in claim 5, further comprising an integrator capacitor and a current sink coupled to the analog feedback loop.

10. A method of operating a multimode fast attack Automatic Gain Control (AGC) circuit in a multimode communication device capable of operating alternatively in a first communication mode or a second communication mode, the multimode fast attack AGC circuit having a forward transmission path with an amplifier stage responsive to receipt of a control signal that alters the amplifier stage gain component and a down mixer for providing a baseband signal at an output, the multimode fast attack AGC circuit for use in a multimode communication device, the method comprising the steps of:

determining if the communication device is in the first communication mode or the second communication mode;

coupling an analog feedback loop between an output of the forward transmission path and the amplifier stage through a first switch means if the communication device is in the first communication mode, thereby providing an analog feedback control signal;

coupling a digital feedback loop between the output of the forward transmission path and the amplifier stage through a first switch means if the communication device is in the second communication mode;

providing a second switch means to alternatively couple a voltage reference or a digital to analog converter means to the analog feedback control signal;

coupling the voltage reference to the analog feedback control signal if the analog feedback control signal is to be preset to a maximum value; and coupling the digital to analog converter means to the analog feedback control signal if the analog feedback control signal is to be preset to an intermediate value.

* * * * *